(12) United States Patent
Wang et al.

(10) Patent No.: US 12,294,796 B2
(45) Date of Patent: May 6, 2025

(54) PHASE DETECTION AUTO FOCUS WITH HORIZONTAL/VERTICAL QUAD PHASE DETECTION

(71) Applicant: OMNIVISION TECHNOLOGIES, INC., Santa Clara, CA (US)

(72) Inventors: Rui Wang, San Jose, CA (US);
Chengcheng Xu, Santa Clara, CA (US);
Lihang Fan, Sunnyvale, CA (US);
Eiichi Funatsu, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 151 days.

(21) Appl. No.: 18/295,207

(22) Filed: Apr. 3, 2023

(65) Prior Publication Data

US 2024/0334085 A1    Oct. 3, 2024

(51) Int. Cl.
| | |
|---|---|
| H04N 5/335 | (2011.01) |
| G02B 5/20 | (2006.01) |
| H04N 25/13 | (2023.01) |
| H04N 25/44 | (2023.01) |
| H04N 25/704 | (2023.01) |
| H04N 25/78 | (2023.01) |

(52) U.S. Cl.
CPC .......... *H04N 25/704* (2023.01); *G02B 5/201* (2013.01); *H04N 25/134* (2023.01); *H04N 25/44* (2023.01); *H04N 25/78* (2023.01)

(58) Field of Classification Search
CPC .................................................. H04N 25/704
See application file for complete search history.

(56) References Cited

U.S. PATENT DOCUMENTS

| | | | |
|---|---|---|---|
| 9,749,556 B2* | 8/2017 | Fettig | H04N 23/667 |
| 11,483,502 B1 | 10/2022 | Deng et al. | |
| 11,736,821 B1* | 8/2023 | Zhou | H04N 25/11 |
| | | | 348/301 |
| 2015/0062391 A1* | 3/2015 | Murata | H01L 27/14627 |
| | | | 348/280 |
| 2020/0280659 A1* | 9/2020 | Galor Gluskin | H04N 23/55 |
| 2021/0337144 A1* | 10/2021 | Wang | H01L 27/14645 |
| 2022/0394201 A1 | 12/2022 | Xu et al. | |
| 2023/0217119 A1* | 7/2023 | Lee | H04N 25/134 |
| | | | 348/272 |

* cited by examiner

*Primary Examiner* — Gary C Vieaux
(74) *Attorney, Agent, or Firm* — Perkins Coie LLP; Daniel L. Jackstadt

(57) ABSTRACT

An imaging device includes a pixel array with 2×2 pixel circuits arranged in rows and columns. Each 2×2 pixel circuit includes 4 photodiodes. Bitlines are coupled to the 2×2 pixel circuits and a color filter array is disposed over photodiodes of the pixel array. The color filter array includes color filters having a first color, color filters having a second color, color filters having a third color. The photodiodes of each 2×2 pixel circuits are covered by one of the color filters. Photodiodes covered by color filters having the first color and photodiodes covered by color filters having the second color are configured to provide non-phase detection (non-PD) information. Photodiodes covered by color filters having the third color are configured to provide phase detection (PD) information. Half of the 2×2 pixel circuits have the photodiodes covered by color filters having the third color.

17 Claims, 10 Drawing Sheets

FIG. 3

PHASE DETECTION AUTO FOCUS WITH HORIZONTAL/VERTICAL QUAD PHASE DETECTION

TECHNICAL FIELD

This disclosure relates generally to image sensors, and in particular but not exclusively, relates to high dynamic range (HDR) complementary metal oxide semiconductor (CMOS) image sensors.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital conversion (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

FIG. 3 illustrates a diagram of example banks of pixel circuits in accordance with the teachings of the present disclosure.

Figure 1:
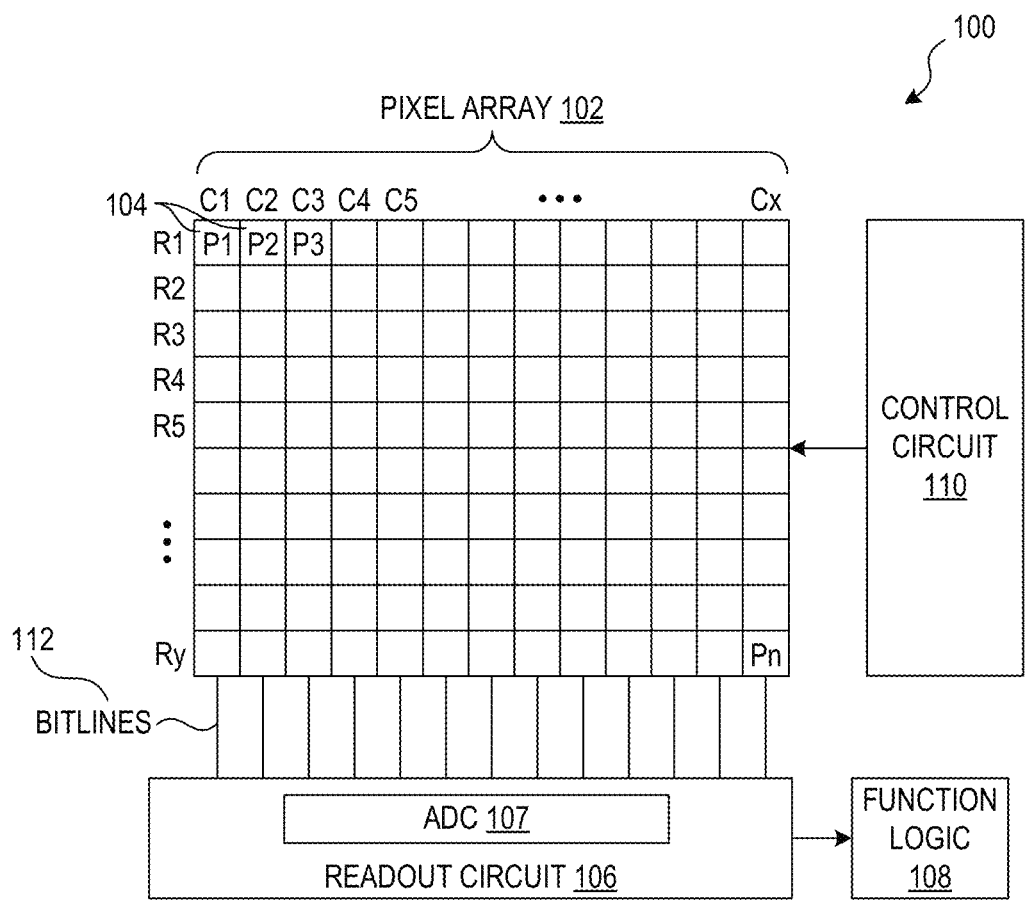
FIG. 1 illustrates one example of an imaging system including a pixel array in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Examples directed to an imaging system with a pixel array providing phase detection autofocus (PDAF) with horizontal/vertical quad phase detection (HV-QPD) are disclosed. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with a pixel array providing phase detection autofocus (PDAF) with horizontal/vertical quad phase detection (HV-QPD) are disclosed. PDAF operates by using a first set of photodiodes for detecting light from one side, using a second set of photodiodes for detecting light from the other side, and measuring the phase difference between the two sets of photodiodes to determine the degree of autofocus needed for the particular image.

In various examples, pixel circuits include 4-cell 2×2 pixel circuits configured to provide PDAF with HV-QPD. The 4 cells of each 2×2 pixel circuit are paired either horizontally or vertically such that the imaging system can measure the phase difference in both horizontal and vertical directions. In various examples, a first half of the pixel array includes pixel circuits configured to provide non-PD information and a second half of the pixel array includes pixel circuits configured to provide PD information. In various examples, the first half of the pixel array is overlayed with red or blue color filters, and the second half of the pixel array is overlayed with green color filters.

Imaging systems using PDAF with HV-QPD in accordance with the teachings of the present disclosure provide tracking the movement of subjects in more directions, improved distance calculation, faster autofocus, and enhanced low-light performance.

To illustrate, FIG. 1 shows one example of an imaging system 100 having a readout circuit 106 in accordance with the teachings of the present disclosure. In particular, the example depicted in FIG. 1 illustrates an imaging system 100 that includes a pixel array 102, bitlines 112, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, the readout circuit 106 may be configured to read out the image signals through the column bitlines 112. As will be discussed, in the various examples, readout circuit 106 may include an analog-to-digital converter (ADC) 107 in accordance with the teachings of the present disclosure. In the example, the digital image data values generated by the analog to digital converters in readout circuit 106 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 may be included in a digital, cell phone, laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
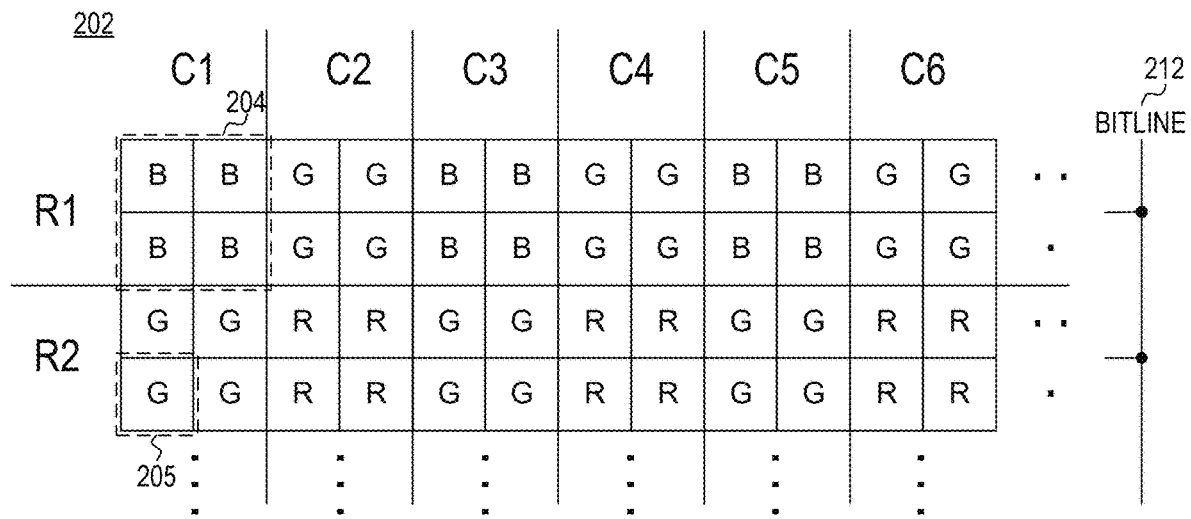
FIGS. 2A and 2B illustrates a schematic of an example bank of 4-cell 2×2 pixel circuits of a pixel array and a schematic of an example pixel circuit, respectively, in accordance with the teachings of the present disclosure.
Figure 2B:
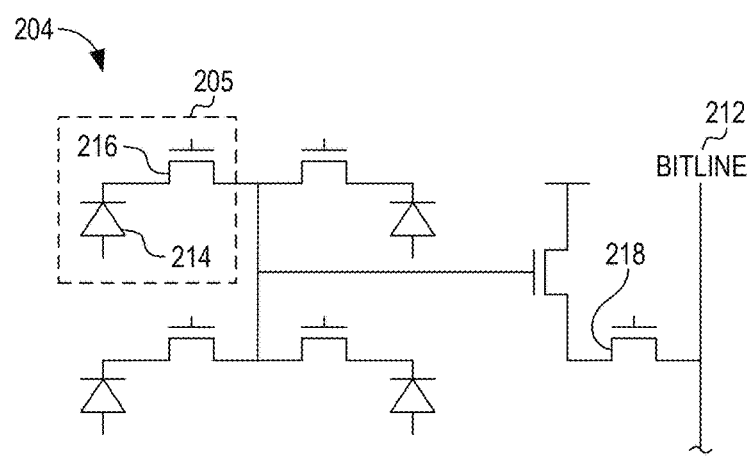

FIGS. 2A and 2B illustrates an example bank of 4-cell 2×2 pixel circuits 204 of a pixel array 202 and one of the pixel circuits 204, respectively, in accordance with the teachings of the present disclosure. It is appreciated that the pixel array 202 of FIG. 2 may be an example of the pixel array 102 included in the imaging system 100 as shown in FIG. 1, and that similarly named and numbered elements described above are coupled and function similarly below.

The pixel array 202 includes a plurality of 2×2 pixel circuits 204 arranged in rows R1, R2, . . . and columns C1, C2, . . . of the pixel array 202 (FIG. 2A). Each pixel circuit 204 includes 4 cells 205, each having a photodiode 214 and a corresponding transfer transistor 216 (FIG. 2B). Each pixel circuit 204 may have one row select transistor 218 (FIG. 2B) shared by the 4 cells 205. One or more bitlines 212 are coupled to read out the plurality of pixel circuits 204. The illustrated example also shows a color filter array disposed over the pixel array 202. The color filter array includes color filters having a first color (e.g., blue, "B"), color filters having a second color (e.g., red, "R"), and color filters having a third color (e.g., green, "G"). In the illustrated example, the color filter array is a Bayer color filter array such that the color filters are arranged in a repeating pattern of 2×2 squares of color filters with repeating blue and green color filters in one row (e.g., the first row R1), and repeating green and red color filters in a neighboring row (e.g., the second row R2).

In various examples, the photodiodes covered by blue or red color filters are configured to provide non-phase detection (non-PD) information, while the photodiodes covered by green color filters are configured to provide phase detection (PD) information. In various examples, a quarter of the 2×2 pixel circuits 204 have photodiodes covered by blue color filters, another quarter of the pixel circuits 204 have photodiodes covered by the red color filters, and the remaining half of the pixel circuits 204 have photodiodes covered by the green color filters. In other words, the pixel array 202 can have a 50% PD density such that half of the pixel circuits 204 are configured to provide non-PD information and the other half of the pixel circuits 204 are configured to provide PD information.

Figure 3:
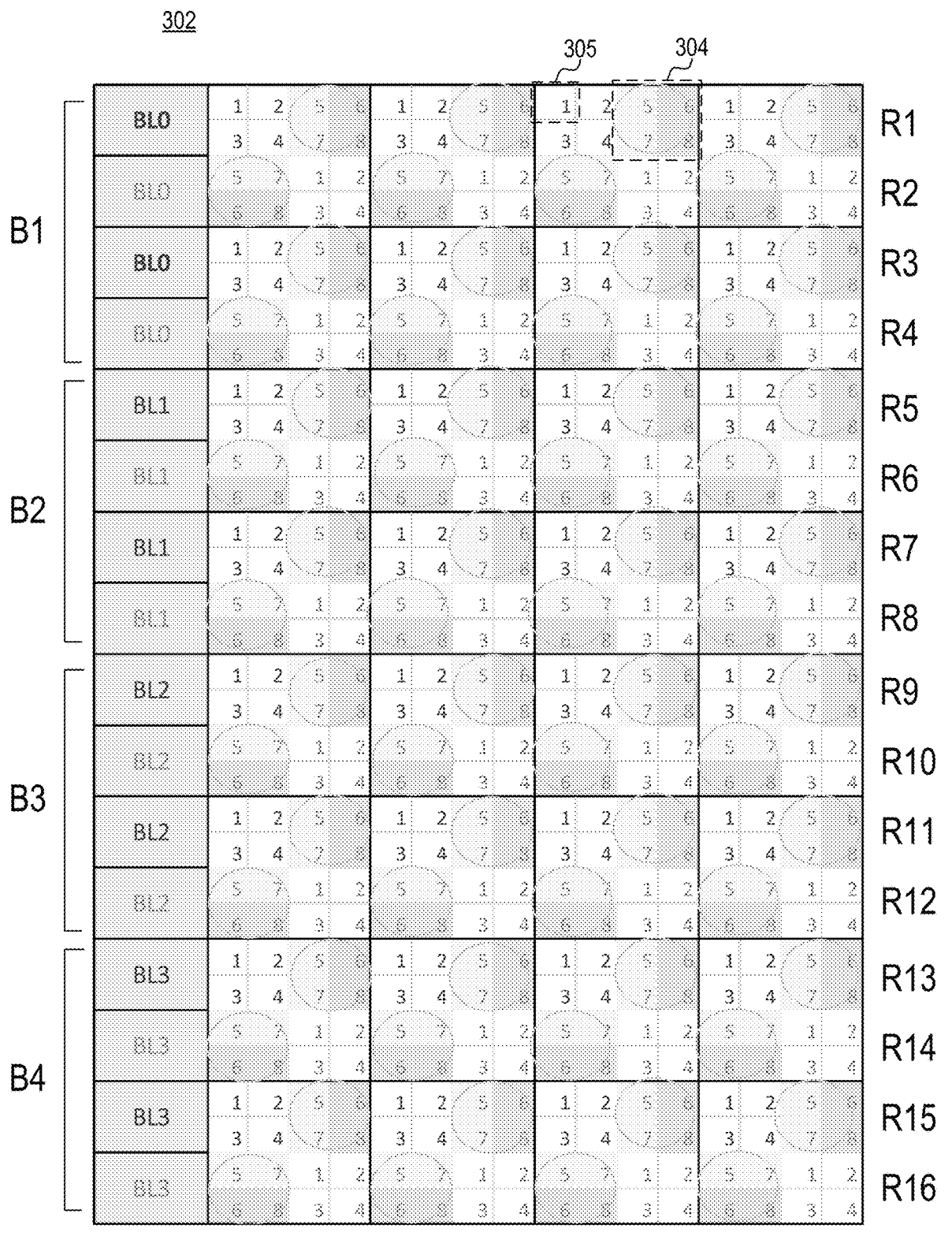

FIG. 3 illustrates a diagram of example banks B1, B2, B3, B4 of pixel circuits 304 in a pixel array 302 in accordance with the teachings of the present disclosure. It is appreciated that the pixel array 302 of FIG. 3 may be an example of the pixel array 102 included in the imaging system 100 as shown in FIG. 1, and that similarly named and numbered elements described above are coupled and function similarly below.

The pixel array 302 includes a plurality of 2×2 pixel circuits 304 arranged in rows R1, R2, . . . of the pixel array 302. Each pixel circuit 304 includes 4 cells 305, each having a photodiode. In various examples, a Bayer color filter array is disposed over the pixel circuits 304 such that the pixel cells 305 numbered 1-4 in the odd numbered rows R1, R3, . . . are covered by blue color filters, the pixel cells 305 numbered 1-4 in the even numbered rows R2, R4, . . . are covered by red color filters, and the pixel cells 305 numbered 5-8 are covered by green color filters. In various examples, the photodiodes covered by blue or red color filters are configured to provide non-PD information, while the photodiodes covered by green color filters are configured to provide PD information.

In the illustrated example, each of the banks B1-4 includes four rows of pixel circuits 304. Each bank can be coupled to its own bitline such that the banks B1-4 can be read out together. For example, the first row of each bank (i.e., R1, R5, R9, R13) can be read out simultaneously in a first readout period, the next row of each bank (i.e., R2, R6, R10, R14) can be read out simultaneously in a second readout period, the following row of each bank (i.e., R3, R7, R11, R15) can be read out simultaneously in a third readout period, and the final row of each bank (i.e., R4, R8, R12, R16) can be read out simultaneously in a fourth readout period.

Figure 4:
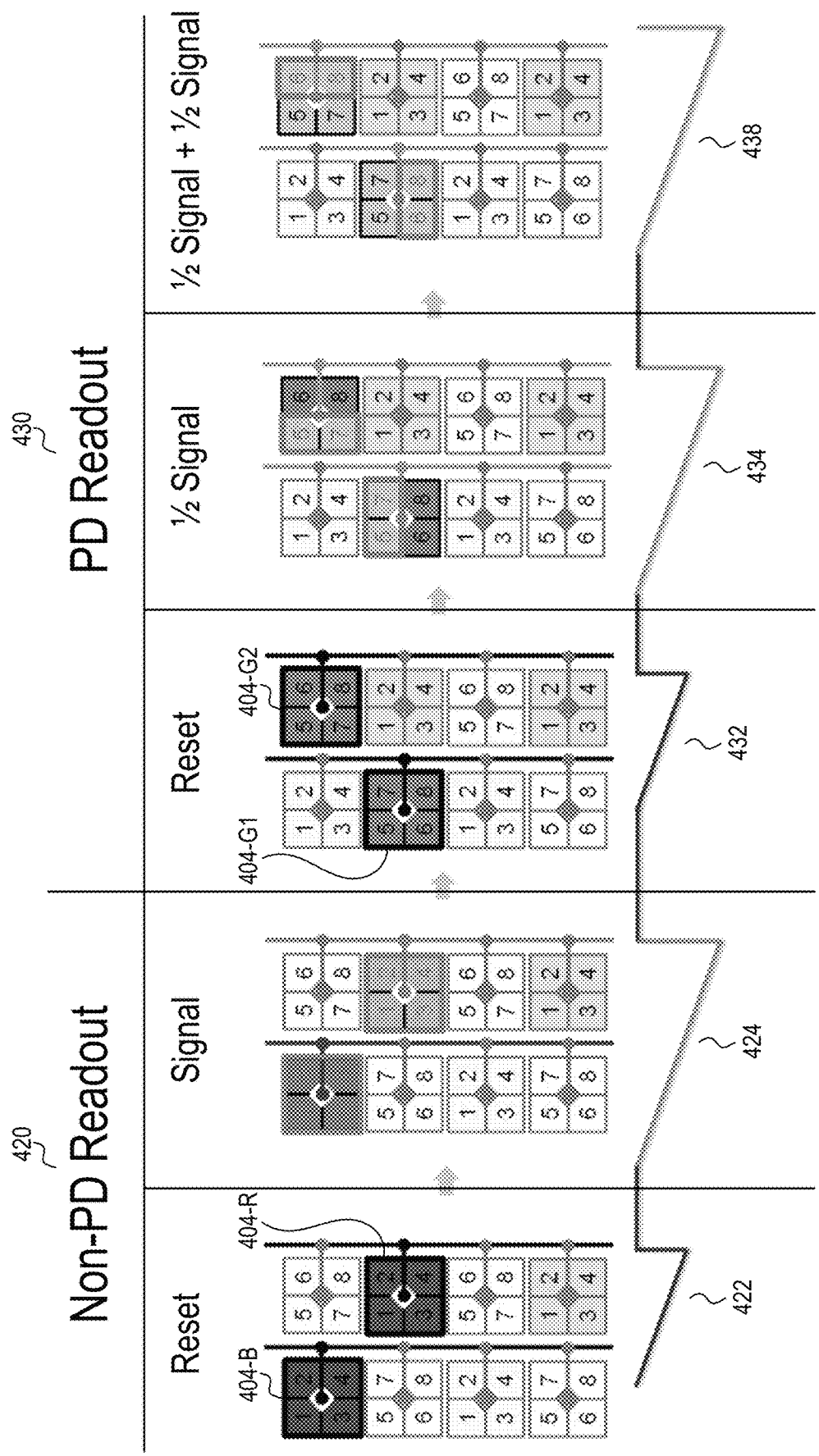
FIG. 4 illustrates an example pixel array and timing diagram depicting example pixel circuits providing phase detection auto focus in accordance with the teachings of the present disclosure.

FIG. 4 illustrates an example pixel array and timing diagram depicting pixel circuits providing phase detection auto focus in accordance with the teachings of the present disclosure. It is appreciated that pixel circuits 404 of FIG. 4 may be examples of the pixel circuits 204 included in the pixel array 202 as shown in FIG. 2, and that similarly named and numbered elements described above are coupled and function similarly below.

Each example shows the same eight pixel circuits 404 of the pixel array with certain portions bolded to highlight which pixel circuits (or which portions of the pixel circuits) are read out at each corresponding step of the timing diagram. In the illustrated example, a Bayer color filter array is disposed over the pixel circuits 404 such that blue pixel circuits 404-B alternate with green pixel circuits 404-G2 in one row, and red pixel circuits 404-R alternate with green pixel circuits 404-G1 in a neighboring row. In the illustrated example, two rows are read out together in each readout period. In various examples, transfer transistors and row select transistors for red and blue pixel circuits 404-R, 404-B are coupled to a first set of control wires, and transfer transistors and row select transistors for green pixel circuits 404-G1, 404-G2 are coupled to a second set of control wires.

An analog-to-digital converter (ADC) (e.g., ADC 107 included in the readout circuit 106 illustrated in FIG. 1) coupled to the pixel circuits 404 can be configured to perform a non-PD readout 420 and a PD readout 430 in each readout period. It is appreciated that the timing diagram shown herein, such as for example in FIG. 4, depicts readouts (e.g., readouts 422, 424, 432, 434, and 438 of the pixel circuits 404) that are represented with corresponding example ramp events that occur in an example ramp signal of the ADC. During the non-PD readout 420, the ADC can be configured to perform a non-PD reset signal readout 422 of the blue pixel circuits 404-B in one row and the red pixel circuits 404-R in the neighboring row. The ADC can be configured to then perform a non-PD image signal readout 424 of the blue and red pixel circuits 404-B, 404-R.

During the PD readout 430, the ADC can be configured to perform a PD reset signal readout 432 of the green pixels 404-G2 in one row and the green pixels 404-G1 in the neighboring row. The ADC can be configured to then perform a first PD image signal readout 434 of half of the cells in each green pixel circuit 404-G1, 404-G2. The ADC can be configured to then perform a second PD image signal readout 438 of both halves of each green pixel circuit 404-G1, 404-G2 (i.e., each green pixel circuit in full).

In the illustrated example, during readout 434, the top half of pixel circuit 404-G1 and the left half of pixel circuit 404-G2 are read out by turning on the transfer transistors corresponding to cells 5 and 7 and keeping the transfer transistors corresponding to cells 6 and 8 off. During readout 438, the bottom half of pixel circuit 404-G1 and the right half of pixel circuit 404-G2 are read out by turning on the transfer transistors corresponding to cells 6 and 8 and keeping the transfer transistors corresponding to cells 5 and 7 off. However, because the pixel circuits 404 have not been reset since readout 432, residual charges from readout 434 corresponding to cells 5 and 7 are also read out (hence both halves of each green pixel circuit 404-G1, 404-G2 are read out during readout 438). While post-processing may be necessary to correct for the residual charges from readout 434, an imaging system in accordance with the illustrated embodiment provides several advantages.

In various examples, during readout 438, the transfer transistors corresponding to cells 5 and 7 are kept on (i.e., all four transfer transistors are on). Most, if not all, of the image charge in cells 5 and 7 were transferred out during readout 434, so keeping their corresponding transfer transistors on is unlikely to significantly affect the total charge readout during readout 438. In fact, keeping the transfer transistors corresponding to cells 5 and 7 on may improve the charge transfer out.

One advantage is that by splitting each green pixel circuit 404-G1, 404-G2 into left-right or top-bottom halves and reading out each half separately, the pixel array is configured to provide horizontal and vertical PD information, enabling the imaging system to perform phase detection autofocus (PDAF) with horizontal/vertical quad phase detection (HV-QPD). Another advantage is that the power and supply data difference from the blue and red pixel circuit readouts will not affect the power and supply data difference from the green pixel circuit readouts. Yet another advantage is that, with a 50% PD density, the timing penalty is approximately only 30% compared to a conventional readout of a pixel array that does not provide any PD information. Moreover, neither PD correction nor a sync FIFO (First-In-First-Out) is needed because an imaging system in accordance with the illustrated embodiment has more balanced power surges.

Figure 5:
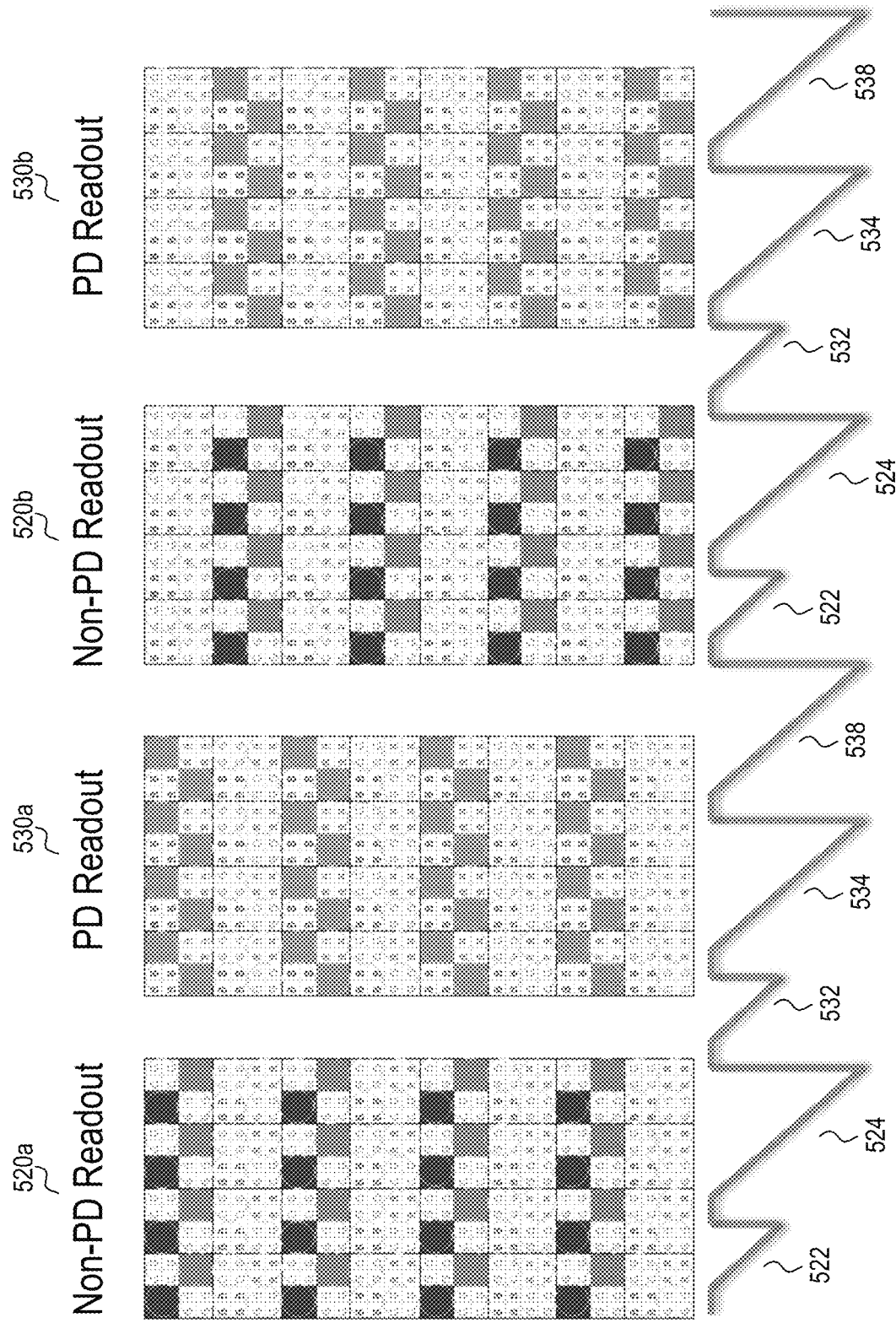
FIG. 5 illustrates another example pixel array and timing diagram of example banks of pixel circuits providing phase detection auto focus in accordance with the teachings of the present disclosure.

FIG. 5 illustrates another example pixel array and timing diagram of example banks of pixel circuits providing phase detection auto focus in accordance with the teachings of the present disclosure. It is appreciated that the diagram in FIG. 5 may be an example of the diagram shown in FIG. 3, and that the timing diagram in FIG. 5 may correspond to the timing diagram shown in FIG. 4, and that similarly named and numbered elements described above are coupled and function similarly below.

The timing diagram illustrated shows a first readout period with a first non-PD readout 520a and a first PD readout 530a, and a second readout period with a second non-PD readout 520b and a second PD readout 530b. The shaded pixels indicate which pixel cells are read out for a given reset signal readout. Blue and red pixel circuits are read out via non-PD reset signal readout 522 and non-PD image signal readout 524. Green pixel circuits are read out via PD reset signal readout 532 and two PD image signal readouts 534 and 538, which provide HV-QPD. During the first readout period, the first two rows of each bank are read out simultaneously. During the second readout period, the next two rows of each bank are read out simultaneously.

Figure 6:
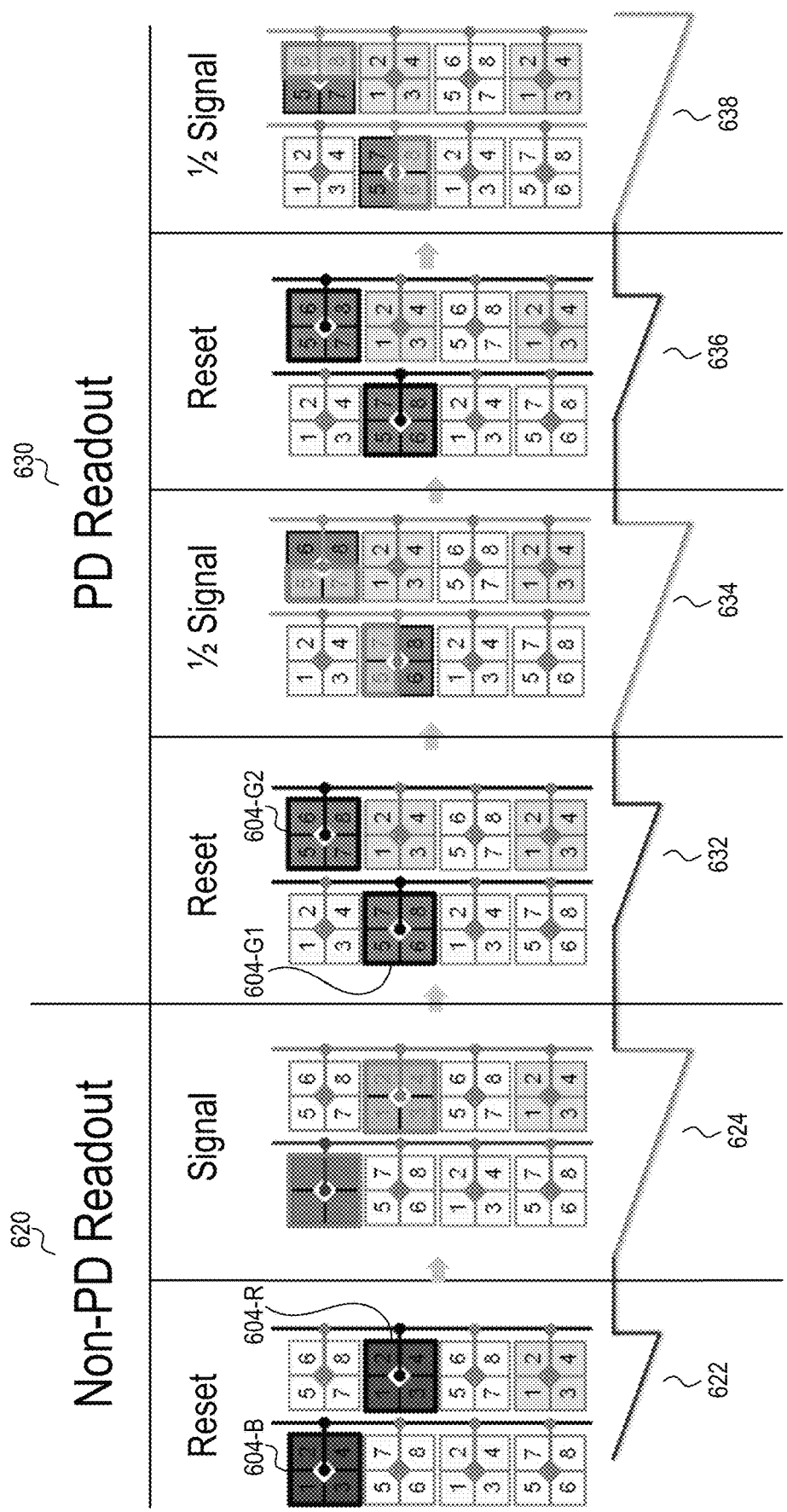
FIG. 6 illustrates yet another example pixel array and timing diagram of an example pixel array providing phase detection auto focus in accordance with the teachings of the present disclosure.

FIG. 6 illustrates yet another example pixel array and timing diagram of the example pixel array providing phase detection auto focus in accordance with the teachings of the present disclosure. It is appreciated that pixel circuits 604 of FIG. 6 may be examples of the pixel circuits 204 included in the pixel array 202 as shown in FIG. 2, and that similarly named and numbered elements described above are coupled and function similarly below.

Each example shows the same eight pixel circuits 604 with certain portions bolded to highlight which pixel circuits (or which portions of the pixel circuits) are read out at each corresponding step of the timing diagram. In the illustrated example, a Bayer color filter array is disposed over the pixel circuits 604 such that blue pixel circuits 604-B alternate with green pixel circuits 604-G2 in one row, and red pixel circuits 604-R alternate with green pixel circuits 604-G1 in a neighboring row. In the illustrated example, two rows are read out together in each readout period.

An analog-to-digital converter (ADC) (e.g., ADC 107 included in the readout circuit 106 illustrated in FIG. 1) coupled to the pixel circuits 604 can be configured to perform a non-PD readout 620 and a PD readout 630 in each readout period. During the non-PD readout 620, the ADC can be configured to perform a non-PD reset signal readout 622 of the blue pixel circuits 604-B in one row and the red pixel circuits 604-R in the neighboring row. The ADC can be configured to then perform a non-PD image signal readout 624 of the blue and red pixel circuits 604-B, 604-R.

During the PD readout 630, the ADC can be configured to perform a first PD reset signal readout 632 of the green pixels 604-G2 in one row and the green pixels 604-G1 in the neighboring row. The ADC can be configured to then perform a first PD image signal readout 634 of half of the cells in each green pixel circuit 604-G1, 604-G2. The ADC can be configured to then perform a second PD reset signal readout 636 of both green pixel circuits 604-G1, 604-G2. The ADC can be configured to then perform a second PD image signal readout 638 of the other half of each green pixel circuit 604-G1, 604-G2.

One advantage of the timing diagram illustrated in FIG. 6 compared to the timing diagram illustrated in FIG. 4 is that because both green pixel circuits 604-G1, 604-G2 are reset during the second PD reset signal readout 636, there are no residual charges from the first PD image signal readout 634 that need to be removed via post-processing. However, a drawback is that the second PD reset signal readout 636 adds additional time to the readout period. For example, with a 50% PD density, the timing penalty is approximately 50% compared to a conventional readout of a pixel array that does not provide any PD information.

Figure 7:
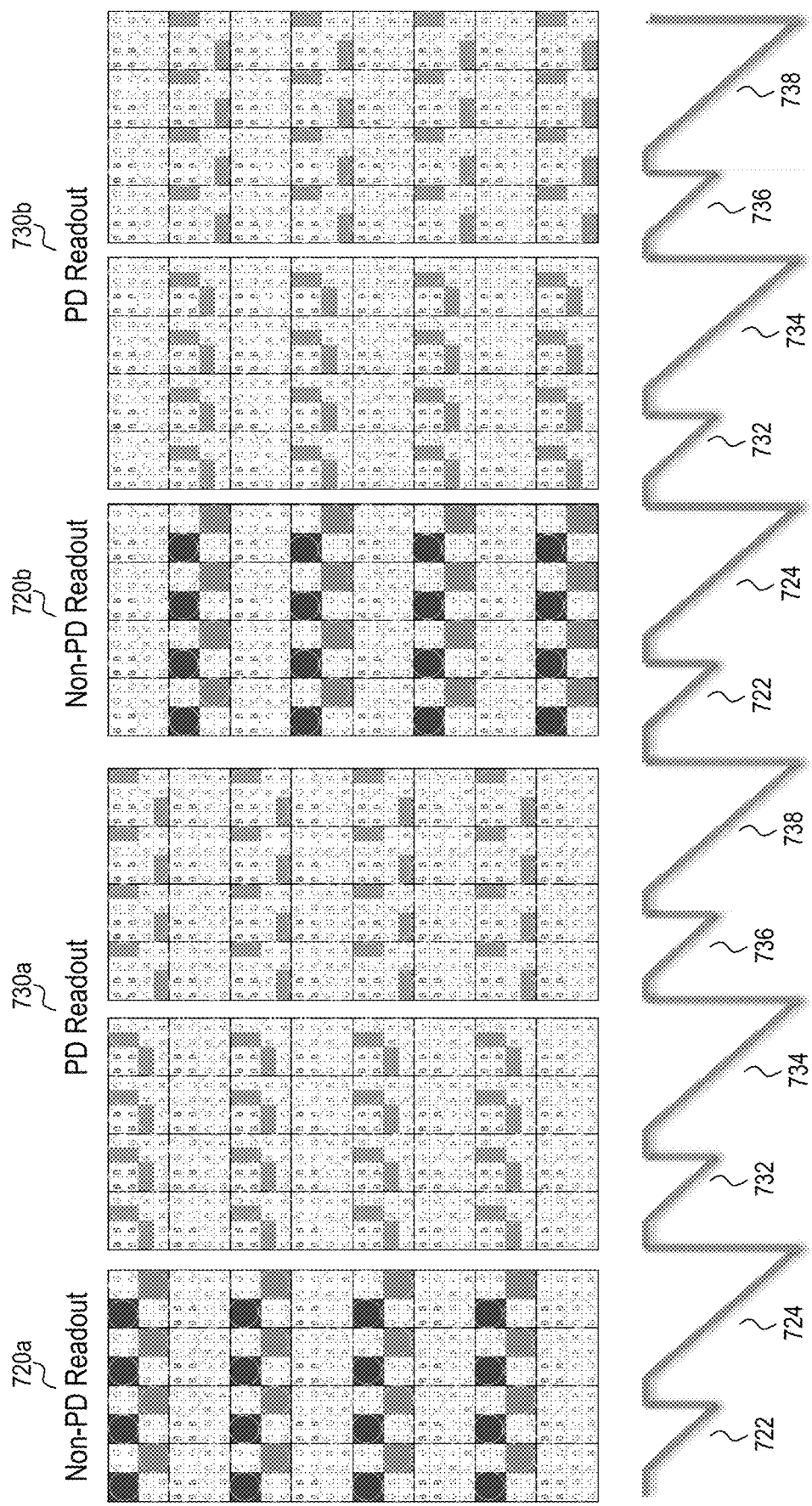
FIG. 7 illustrates still another example pixel array and timing diagram of example banks of pixel circuits providing phase detection auto focus in accordance with the teachings of the present disclosure.

FIG. 7 illustrates still another example pixel array and timing diagram of example banks of pixel circuits providing phase detection auto focus in accordance with the teachings of the present disclosure. It is appreciated that the diagram in FIG. 7 may be an example of the diagram shown in FIG. 6, and that the timing diagram in FIG. 7 may correspond to the timing diagram shown in FIG. 6, and that similarly named and numbered elements described above are coupled and function similarly below.

The timing diagram illustrated shows a first readout period with a first non-PD readout 720a and a first PD readout 730a, and a second readout period with a second non-PD readout 720b and a second PD readout 730b. The shaded pixels indicate which pixel cells are read out for a given reset signal readout. Blue and red pixel circuits are read out via non-PD reset signal readout 722 and non-PD image signal readout 724. Green pixel circuits are read out via first PD reset signal readout 732, first PD image signal readout 734, second PD reset signal readout 736, and second PD image signal readout 738. The PD image signal readouts 734, 738 provide HV-QPD. During the first readout period, the first two rows of each bank are read out simultaneously. During the second readout period, the next two rows of each bank are read out simultaneously.

Figure 8:
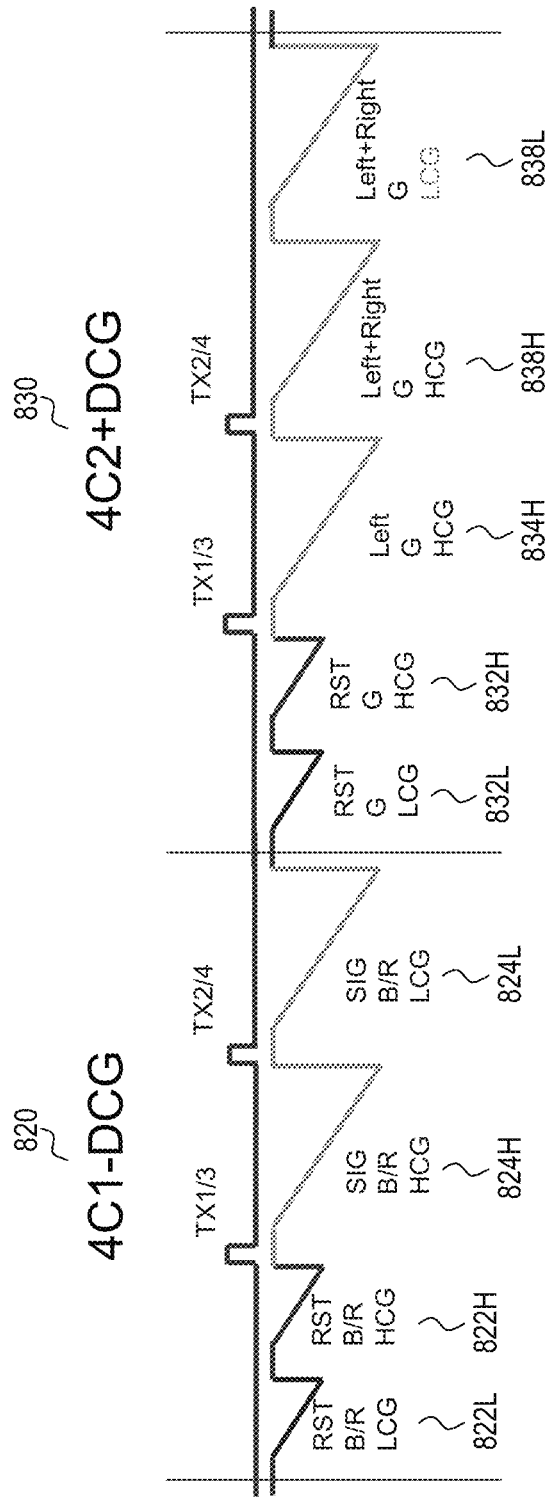
FIG. 8 illustrates another example timing diagram of an example pixel array providing phase detection auto focus in accordance with the teachings of the present disclosure.

FIG. 8 illustrates another example timing diagram of an example pixel array providing phase detection auto focus in accordance with the teachings of the present disclosure. It is appreciated that the timing diagram illustrated in FIG. 8 may be an example timing diagram of the pixel array 202 shown in FIG. 2, and that similarly named and numbered elements described above are coupled and function similarly below.

The timing diagram illustrated provides an alternative readout period using dual conversion gain (DCG). An analog-to-digital converter (ADC) (e.g., ADC 107 included in the readout circuit 106 illustrated in FIG. 1) coupled to the pixel circuits 404 can be configured to perform a non-PD 4C1 DCG readout 820 and a PD 4C2+ DCG readout 830. During the non-PD 4C1 DCG readout 820, the ADC can be configured to perform a non-PD low conversion gain (LCG) reset signal readout 822L and a non-PD high conversion gain (HCG) reset signal readout 822H of blue and red pixel circuits. The ADC can be configured to then perform a non-PD HCG image signal readout 824H and a non-PD LCG image signal readout 824L of the blue and red pixel circuits.

During the PD 4C2+ DCG readout 830, the ADC can be configured to perform a PD LCG reset signal readout 832L and a PD HCG reset signal readout 832H of green pixel circuits. The ADC can be configured to then perform a first PD HCG image signal readout 834H of half of the cells in each green pixel circuit and a second PD HCG image signal readout 838H of both halves of each green pixel circuit. The ADC can be configured to then perform a PD LCG image signal readout 838L of both halves of each green pixel circuit. With a 50% PD density, an imaging system using the DCG timing diagram illustrated in FIG. 8 has a timing penalty of 15% compared to a conventional DCG readout of a pixel array that does not provide any PD information. This is a smaller timing penalty compared to an imaging system with a 100% PD density, which has a timing penalty of 30% compared to a conventional DCG readout of a pixel array that does not provide any PD information.

Figure 9A:
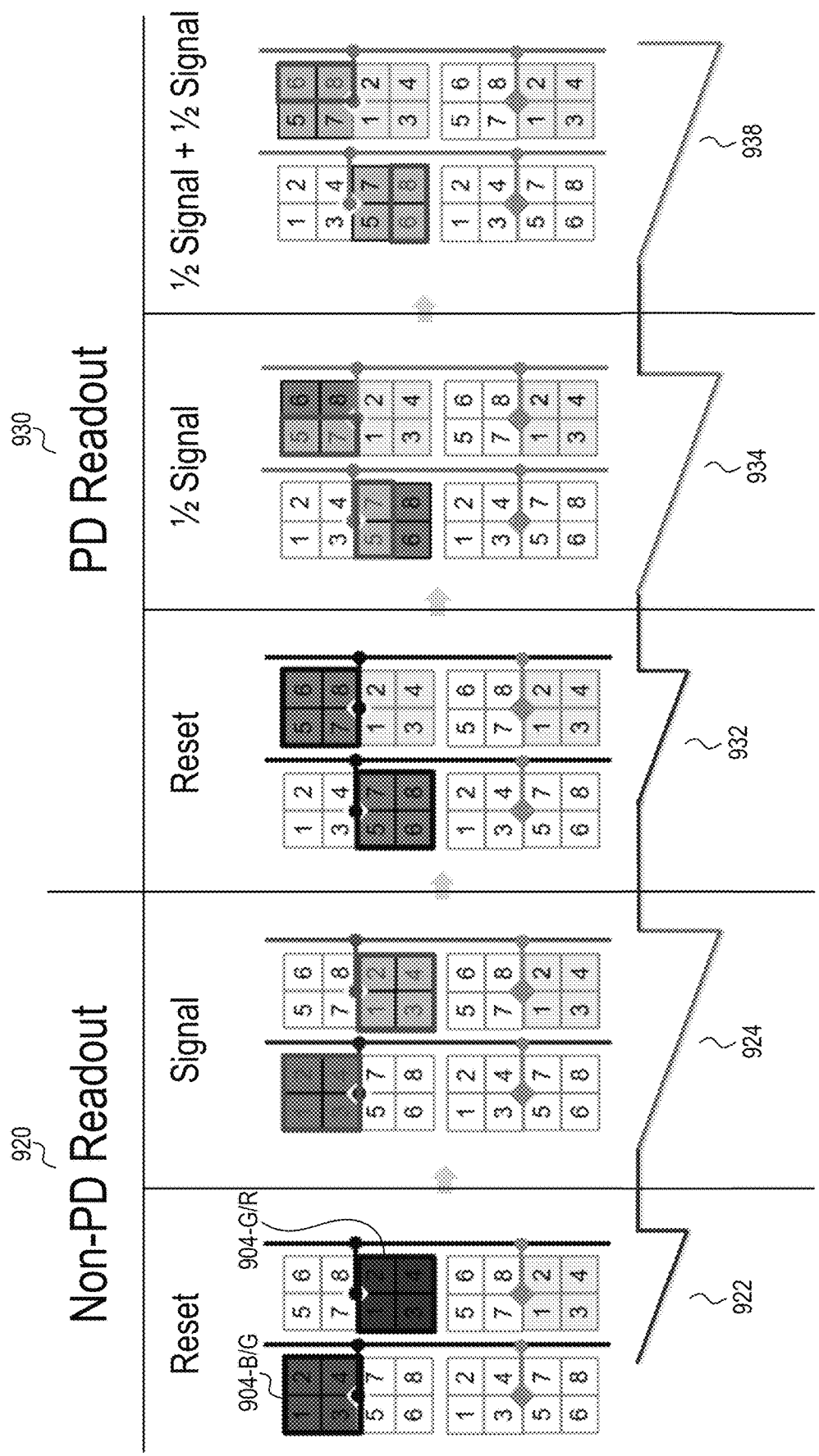
FIGS. 9A and 9B illustrates yet another example pixel array and timing diagram of the example pixel array providing phase detection auto focus, and a schematic of an example pixel circuit, respectively, in accordance with the teachings of the present disclosure.
Figure 9B:
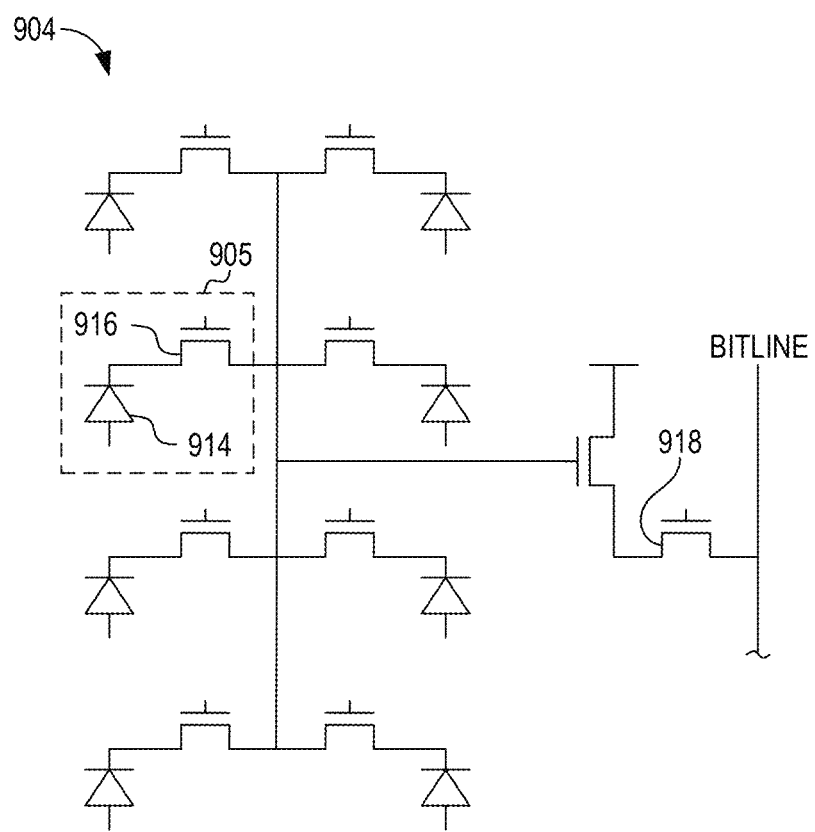

FIGS. 9A and 9B illustrates yet another example pixel array and timing diagram of the example pixel array providing phase detection auto focus, and a schematic of an example pixel circuit 904, respectively, in accordance with the teachings of the present disclosure. It is appreciated that the pixel array shown in FIG. 9 may be an example of the pixel array 102 included in the imaging system 100 as shown in FIG. 1, and that similarly named and numbered elements described above are coupled and function similarly below.

The pixel array (FIG. 9A) includes 2×4 pixel circuits 904, each with 8 pixel cells—corresponding to 8 photodiodes 914 and 8 transfer transistors 916—sharing one row select transistor 918 (FIG. 9B). For example, a first pixel circuit 904-B/G (FIG. 9A) includes 4 blue pixel cells and 4 green pixel cells sharing one row select transistor, and a second pixel cell 904—G/R includes 4 green pixel cells and 4 red pixel cells sharing another row select transistor. During the readout period, which includes non-PD readout 920 and PD readout 930, the transfer transistors in the pixel cells are controlled such that only the blue or red pixel cells of each 2×4 pixel circuit 904 are read out during the non-PD readout 920, and only the green pixel cells of each 2×4 pixel circuit 904 are read out during the PD readout 930.

During the non-PD readout 920, an ADC can be configured to perform a non-PD reset signal readout 922 of the blue pixel cells in pixel circuit 904-B/G and the red pixel cells in pixel circuit 904-G/R. The ADC can be configured to then perform a non-PD image signal readout 924 of the blue and red pixel cells.

During the PD readout 930, the ADC can be configured to perform a PD reset signal readout 932 of the green pixels in pixel circuits 904-B/G, 904-G/R. The ADC can be configured to then perform a first PD image signal readout 934 of half of the green pixel cells in each pixel circuit. The ADC can be configured to then perform a second PD image signal readout 938 of both halves of the green pixel cells (i.e., all green pixel cells in full).

By splitting the green pixel cells into left-right or top-bottom halves and reading out each half separately, the pixel array is configured to provide horizontal and vertical PD information, enabling the imaging system to perform PDAF with HV-QPD. Similar to the embodiment illustrated in FIG. 4, with a 50% PD density, the timing penalty is approximately only 30% compared to a conventional readout of a pixel array that does not provide any PD information.

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

What is claimed is:

1. An imaging device, comprising:
   a pixel array including:
      a plurality of 2×2 pixel circuits arranged in rows and columns of the pixel array, wherein each 2×2 pixel circuit includes 4 photodiodes; and
      a plurality of bitlines coupled to the plurality of 2×2 pixel circuits; and
      a color filter array disposed over the photodiodes of the pixel array, wherein the color filter array comprises:
      a plurality of color filters having a first color;
      a plurality of color filters having a second color; and
      a plurality of color filters having a third color, wherein the photodiodes of each one of the plurality of 2×2 pixel circuits are covered by one of the plurality of the color filters having the first color, the plurality of the color filters having the second color, and the plurality of the color filters having the third color,
   wherein the photodiodes covered by the color filters having the first color and the photodiodes covered by the color filters having the second color are configured to provide non-phase detection (non-PD) information for the pixel array,
   wherein the photodiodes covered by the color filters having the third color are configured to provide phase detection (PD) information for the pixel array,
   wherein half of the plurality of 2×2 pixel circuits have the photodiodes covered by the color filters having the third color,
   wherein the photodiodes covered by the color filters having the third color in a first half of the 2×2 pixel circuits are configured to provide horizontal PD information for the pixel array, and
   wherein the photodiodes covered by the color filters having the third color in a second half of the 2×2 pixel circuits are configured to provide vertical PD information for the pixel array.

2. The imaging device of claim 1, further comprising an analog-to-digital converter (ADC) coupled to the plurality of bitlines and configured to perform a non-PD readout and a PD readout,
   wherein during the non-PD readout, the ADC is configured to perform—
      a non-PD reset signal readout of the photodiodes covered by the color filters having the first color in at least one of the 2×2 pixel circuits and the photodiodes covered by the color filters having the second color in at least one of the 2×2 pixel circuits; and
      a non-PD image signal readout of the photodiodes covered by the color filters having the first color in the at least one of the 2×2 pixel circuits and the photodiodes covered by the color filters having the second color in the at least one of the 2×2 pixel circuits.

3. The imaging device of claim 2, wherein during the non-PD readout, the ADC is configured to perform—
   a PD reset signal readout of the photodiodes covered by the color filters having the third color in at least two of the 2×2 pixel circuits;
   a first PD image signal readout of half of the photodiodes covered by the color filters having the third color in each of the at least two of the 2×2 pixel circuits; and
   a second PD image signal readout of the photodiodes covered by the color filters having the third color in each of the at least two of the 2×2 pixel circuits.

4. The imaging device of claim 2, wherein during the non-PD readout, the ADC is configured to perform—
   a first PD reset signal readout of the photodiodes covered by the color filters having the third color in at least two of the 2×2 pixel circuits;
   a first PD image signal readout of a first half of the photodiodes covered by the color filters having the third color in each of the at least two of the 2×2 pixel circuits;
   a second PD reset signal readout of the photodiodes covered by the color filters having the third color in each of the at least two of the 2×2 pixel circuits; and
   a first PD image signal readout of a second half of the photodiodes covered by the color filters having the third color in each of the at least two of the 2×2 pixel circuits.

5. The imaging device of claim 1, further comprising an analog-to-digital converter (ADC) coupled to the plurality of bitlines and configured to perform a non-PD dual conversion gain (DCG) readout and a PD DCG readout,
   wherein during the non-PD DCG readout, the ADC is configured to perform—
      a non-PD low conversion gain (LCG) reset signal readout of the photodiodes covered by the color filters having the first color in at least one of the 2×2 pixel circuits and the photodiodes covered by the color filters having the second color in at least one of the 2×2 pixel circuits;

a non-PD high conversion gain (HCG) reset signal readout of the photodiodes covered by the color filters having the first color in at least one of the 2×2 pixel circuits and the photodiodes covered by the color filters having the second color in at least one of the 2×2 pixel circuits;

a non-PD HCG image signal readout of a first half of the photodiodes covered by the color filters having the first color in the at least one of the 2×2 pixel circuits and a first half of the photodiodes covered by the color filters having the second color in the at least one of the 2×2 pixel circuits; and a non-PD LCG image signal readout of a second half of the photodiodes covered by the color filters having the first color in the at least one of the 2×2 pixel circuits and a second half of the photodiodes covered by the color filters having the second color in the at least one of the 2×2 pixel circuits;

wherein during the non-PD DCG readout, the ADC is configured to perform— a PD LCG reset signal readout of the photodiodes covered by the color filters having the third color in at least two of the 2×2 pixel circuits;

a PD HCG reset signal readout of the photodiodes covered by the color filters having the third color in each of at least two of the 2×2 pixel circuits;

a first PD HCG image signal readout of half of the photodiodes covered by the color filters having the third color in each of the at least two of the 2×2 pixel circuits;

a second PD HCG image signal readout the photodiodes covered by the color filters having the third color in each of the at least two of the 2×2 pixel circuits; and a PD LCG image signal readout the photodiodes covered by the color filters having the third color in each of the at least two of the 2×2 pixel circuits.

6. The imaging device of claim 1,
wherein in a first row of the pixel array, the 2×2 pixel circuits with the photodiodes covered by the color filters having the first color alternate with the 2×2 pixel circuits with the photodiodes covered by the color filters having the third color, and wherein in a second row of the pixel array, the 2×2 pixel circuits with the photodiodes covered by the color filters having the second color alternate with the 2×2 pixel circuits with the photodiodes covered by the color filters having the third color.

7. The imaging device of claim 1, wherein each one of the plurality of bitlines is coupled to 2×2 pixel circuits in four rows, and wherein during each readout period, two of the four rows are configured to be read out through each bitline simultaneously.

8. The imaging device of claim 1, wherein each 2×2 pixel circuit includes a plurality of transfer transistors and a plurality of row select transistors, wherein the transfer transistors and row select transistors of the 2×2 pixel circuits with the photodiodes covered by the color filters having the first color or the photodiodes covered by the color filters having the second color are coupled to a first set of control wires, and wherein the transfer transistors and row select transistors of the 2×2 pixel circuits with the photodiodes covered by the color filters having the third color are coupled to a second set of control wires.

9. The imaging device of claim 1, wherein the first color is blue, wherein the second color is red, wherein the third color is green.

10. An imaging device, comprising:
a pixel array including:
a plurality of 2×4 pixel circuits arranged in rows and columns of the pixel array, wherein each 2×4 pixel circuit includes 8 photodiodes, 8 transfer transistors, and 1 row select transistor; and
a plurality of bitlines coupled to the plurality of 2×4 pixel circuits; and
a color filter array disposed over the photodiodes of the pixel array, wherein the color filter array comprises:
a plurality of color filters having a first color;
a plurality of color filters having a second color; and
a plurality of color filters having a third color, wherein the photodiodes of a first half of each one of the plurality of 2×4 pixel circuits are covered by the plurality of the color filters having the first color or the second color, wherein the photodiodes of a second half of each one of the plurality of 2×4 pixel circuits are covered by the plurality of the color filters having the third color, wherein the photodiodes covered by the color filters having the first color and the photodiodes covered by the color filters having the second color are configured to provide non-phase detection (non-PD) information for the pixel array, wherein the photodiodes covered by the color filters having the third color are configured to provide phase detection (PD) information for the pixel array, wherein the photodiodes covered by the color filters having the third color in a first half of the 2×4 pixel circuits are configured to provide horizontal PD information for the pixel array, and wherein the photodiodes covered by the color filters having the third color in a second half of the 2×4 pixel circuits are configured to provide vertical PD information for the pixel array.

11. The imaging device of claim 10, further comprising an analog-to-digital converter (ADC) coupled to the plurality of bitlines and configured to perform a non-PD readout and a PD readout, wherein during the non-PD readout, the ADC is configured to perform— a non-PD reset signal readout of the photodiodes covered by the color filters having the first color in at least one of the 2×4 pixel circuits and the photodiodes covered by the color filters having the second color in at least one of the 2×4 pixel circuits; and a non-PD image signal readout of the photodiodes covered by the color filters having the first color in the at least one of the 2×4 pixel circuits and the photodiodes covered by the color filters having the second color in the at least one of the 2×4 pixel circuits.

12. The imaging device of claim 11, wherein during the non-PD readout, the ADC is configured to perform— a PD reset signal readout of the photodiodes covered by the color filters having the third color in at least two of the 2×4 pixel circuits;

a first PD image signal readout of half of the photodiodes covered by the color filters having the third color in each of the at least two of the 2×4 pixel circuits; and a second PD image signal readout of the photodiodes covered by the color filters having the third color in each of the at least two of the 2×4 pixel circuits.

13. The imaging device of claim 11, wherein during the non-PD readout, the ADC is configured to perform—
- a first PD reset signal readout of the photodiodes covered by the color filters having the third color in at least two of the 2×4 pixel circuits;
- a first PD image signal readout of a first half of the photodiodes covered by the color filters having the third color in each of the at least two of the 2×4 pixel circuits;
- a second PD reset signal readout of the photodiodes covered by the color filters having the third color in each of the at least two of the 2×4 pixel circuits with; and
- a first PD image signal readout of a second half of the photodiodes covered by the color filters having the third color in each of the at least two of the 2×4 pixel circuits.

14. A method of operating a readout circuit, comprising:
coupling the readout circuit to a plurality of 2×2 pixel circuits arranged in rows and columns of a pixel array, wherein each 2×2 pixel circuit includes 4 photodiodes, wherein the photodiodes of each 2×2 pixel circuit are covered by one of a plurality of color filters having a first color, a plurality of color filters having a second color, and a plurality of color filters having a third color, wherein the photodiodes covered by the color filters having the first color or the photodiodes covered by the color filters having the second color are configured to provide non-phase detection (non-PD) information for the pixel array, wherein the photodiodes covered by the color filters having the third color are configured to provide phase detection (PD) information for the pixel array, and wherein half of the plurality of 2×2 pixel circuits have the photodiodes covered by the color filters having the third color;
performing a non-phase detection (non-PD) readout, comprising:
- reading out a non-PD reset signal from the photodiodes covered by the color filters having the first color in at least one of the plurality of 2×2 pixel circuits and the photodiodes covered by the color filters having the second color in at least one of the plurality of 2×2 pixel circuits;
- reading out a non-PD image signal from the photodiodes covered by the color filters having the first color in the at least one of the plurality of 2×2 pixel circuits and the photodiodes covered by the color filters having the second color in the at least one of the plurality of 2×2 pixel circuits;
- configuring the photodiodes covered by the color filters having the third color in a first half of the 2×2 pixel circuits to provide horizontal PD information for the pixel array;
- configuring the photodiodes covered by the color filters having the third color in a second half of the 2×2 pixel circuits to provide vertical PD information for the pixel array; and
performing a phase detection (PD) readout.

15. The method of claim 14, wherein the PD readout comprises:
- reading out a PD reset signal from the photodiodes covered by the color filters having the third color in at least two of the 2×2 pixel circuits;
- reading out a first PD image signal from half of the photodiodes covered by the color filters having the third color in each of the at least two of the 2×2 pixel circuits; and
- reading out a second PD image signal from the photodiodes covered by the color filters having the third color in each of the at least two of the 2×2 pixel circuits.

16. The method of claim 14, wherein the PD readout comprises:
- reading out a first PD reset signal from the photodiodes covered by the color filters having the third color in at least two of the 2×2 pixel circuits;
- reading out a first PD image signal from a first half of the photodiodes covered by the color filters having the third color in each of the at least two of the 2×2 pixel circuits;
- reading out a second PD reset signal from the photodiodes covered by the color filters having the third color in each of at least two of the 2×2 pixel circuits; and
- reading out a second PD image signal from a second half of the photodiodes covered by the color filters having the third color in each of the at least two of the 2×2 pixel circuits.

17. The method of claim 14, wherein the first color is blue, wherein the second color is red, wherein the third color is green.

* * * * *